US012620772B2

(12) United States Patent
Kitajima

(10) Patent No.: US 12,620,772 B2
(45) Date of Patent: May 5, 2026

(54) LIGHT EMITTING DEVICE

(71) Applicant: NICHIA CORPORATION, Anan (JP)

(72) Inventor: Tadayuki Kitajima, Itano-gun (JP)

(73) Assignee: NICHIA CORPORATION, Anan (JP)

( * ) Notice: Subject to any disclaimer, the term of this patent is extended or adjusted under 35 U.S.C. 154(b) by 759 days.

(21) Appl. No.: 18/008,502

(22) PCT Filed: Jun. 2, 2021

(86) PCT No.: PCT/JP2021/020974
§ 371 (c)(1),
(2) Date: Dec. 6, 2022

(87) PCT Pub. No.: WO2021/251233
PCT Pub. Date: Dec. 16, 2021

(65) Prior Publication Data
US 2023/0344192 A1 Oct. 26, 2023

(30) Foreign Application Priority Data

Jun. 8, 2020 (JP) ................................. 2020-099015

(51) Int. Cl.
*H01S 5/02255* (2021.01)
*H01S 5/00* (2006.01)
(Continued)

(52) U.S. Cl.
CPC ........ *H01S 5/02255* (2021.01); *H01S 5/0087* (2021.01); *H01S 5/4025* (2013.01); *H01S 5/4031* (2013.01); *H10H 20/851* (2025.01)

(58) Field of Classification Search
CPC .. H01S 5/02255; H01S 5/0087; H01S 5/4025; H01S 5/4031; H10H 20/851
See application file for complete search history.

(56) References Cited

U.S. PATENT DOCUMENTS 6,646,975 B1 11/2003 Uchizaki et al.
2002/0093893 A1 7/2002 Matsuda
(Continued)

FOREIGN PATENT DOCUMENTS

JP 2000-011417 A 1/2000
JP 2001-044574 A 2/2001
(Continued)

OTHER PUBLICATIONS

International Search Report with English Translation and Written Opinion dated Aug. 10, 2021 in corresponding International Application No. PCT/JP2021/020974.

*Primary Examiner* — Yuanda Zhang
(74) *Attorney, Agent, or Firm* — Foley & Lardner LLP

(57) ABSTRACT

A light emitting device includes: a base having a mounting surface; one or more light reflective members arranged on the mounting surface and providing one or more light reflective surfaces on one virtual plane; a first light-emitting element having a first light-exiting surface facing toward the one or more light reflective surfaces, arranged on the mounting surface such that the first light-exiting surface is oblique relative to the one or more light reflective surfaces, and wherein light emitted from the first light-exiting surface is irradiated on the one or more light reflective surfaces; and a second light-emitting element having a second light-exiting surface facing toward the one or more light reflective surfaces, arranged on the mounting surface such that the second light-exiting surface is oblique relative to the first light-exiting surface, and wherein light emitted from the second light-exiting surface is irradiated on the one or more light reflective surfaces.

16 Claims, 7 Drawing Sheets

(51) Int. Cl.
　　 *H01S 5/40* 　　　 (2006.01)
　　 *H10H 20/851* 　　 (2025.01)

(56) 　　　　　　 References Cited

U.S. PATENT DOCUMENTS

| | | | |
|---|---|---|---|
| 2002/0097659 A1 | 7/2002 | Furuhata et al. | |
| 2012/0039072 A1 | 2/2012 | Lell et al. | |
| 2019/0058303 A1* | 2/2019 | Miura | H01S 5/0071 |
| 2019/0234565 A1* | 8/2019 | Kitajima | F21V 7/10 |
| 2019/0285248 A1* | 9/2019 | Kamiya | F21V 7/0008 |
| 2020/0036158 A1 | 1/2020 | Miyata et al. | |
| 2020/0266605 A1* | 8/2020 | Kitajima | H01S 5/02326 |
| 2020/0332984 A1* | 10/2020 | Yamashita | H01S 5/02255 |

FOREIGN PATENT DOCUMENTS

| | | | |
|---|---|---|---|
| JP | 2001-068794 A | 3/2001 | |
| JP | 2001-298236 A | 10/2001 | |
| JP | 2002-008258 A | 1/2002 | |
| JP | 2002-025104 A | 1/2002 | |
| JP | 2002-163837 A | 6/2002 | |
| JP | 2012-512508 A | 5/2012 | |
| JP | 2013-016566 A | 1/2013 | |
| JP | 2019-134017 A | 8/2019 | |
| JP | 2020-021761 A | 2/2020 | |

* cited by examiner

LIGHT EMITTING DEVICE

CROSS-REFERENCE TO RELATED APPLICATIONS

This is a national stage application of PCT Application No. PCT/JP2021/020974, filed on Jun. 2, 2021, which claims priority to Japanese Patent Application No. 2020-099015, filed on Jun. 8, 2020.

BACKGROUND

The present disclosure relates to a light emitting device.

Japanese Patent Publication No. 2020-21761 discloses a light-source device, wherein light emitted from a plurality of light-emitting elements are reflected by the reflective surface of a stand-up mirror to be emitted to the outside.

SUMMARY

With the light-source device of Japanese Patent Publication No. 2020-21761, optical axes of light emitted from the light-emitting elements are parallel to each other. Therefore, it is believed that normally a light extraction region is ensured whose length is equal to or greater than the distance between the emission points of light-emitting elements that are arranged at opposite ends.

On the other hand, not all light emitting devices are required to have a wide light extraction region as in Japanese Patent Publication No. 2020-21761. Depending on the size of the light extraction region and the characteristics of the light extracted therefrom, there is room for improvement in the arrangement of the components in a light emitting device.

A light emitting device disclosed herein includes: a base having a mounting surface; one or more light reflective members arranged on the mounting surface and providing one or more light reflective surfaces on one virtual plane; a first light-emitting element having a first light-exiting surface facing toward the one or more light reflective surfaces, arranged on the mounting surface such that the first light-exiting surface is oblique relative to the one or more light reflective surfaces in a top view, and wherein light emitted from the first light-exiting surface is irradiated on the one or more light reflective surfaces; and a second light-emitting element having a second light-exiting surface facing toward the one or more light reflective surfaces, arranged on the mounting surface such that the second light-exiting surface is oblique relative to the first light-exiting surface in a top view, and wherein light emitted from the second light-exiting surface is irradiated on the one or more light reflective surfaces, wherein light from the first light-emitting element and light from the second light-emitting element reflected by the one or more light reflective surfaces are brought closer to each other before entering a light extraction region of the light emitting device.

According to an embodiment of the present disclosure, a light emitting device is realized in which light from a plurality of light-emitting elements are condensed onto a light extraction region, and the light is extracted effectively.

DETAILED DESCRIPTION

For the scope of the present specification and the claims, the term "polygon" (e.g., a triangle or a rectangle) encompasses those with rounded corners, chamfered corners or beveled corners. The term "polygon" also encompasses those in which an intermediate portion of a side (as opposed to a corner, i.e., the end of the side), is deformed. That is, any shape that is obtained by partially deforming a polygon falls within the meaning of a "polygon" as defined in the present specification and the claims.

This applies not only to "polygon" but also to any term representing a particular shape such as a trapezoid, a circle or a convex/concave shape. This also applies when referring to a side of a shape. That is, even a corner or an intermediate portion of a side is deformed, the "side" is defined to include the deformed portion. Note that the term "in the strict sense" (e.g., "a rectangle in the strict sense") may be used to refer to a "polygon" or a "side" with no partial deformation, as opposed to a "polygon" or a "side" that is partially deformed.

Expressions such as up-down, left-right, top-reverse, front-rear and near-far as used in the present specification or the claims merely state the positional, orientational or directional relative relationship, and do not need to coincide with the relationship when used.

Where there is more than one of the same component, they may be prefixed with "first", "second", etc., in order to distinguish them from one another in the present specification or the claims. Where how the distinction is made in the present specification is different from that in the claims, the same prefix may not refer to the same member in the present specification and in the claims.

For example, if objects are prefixed with "first", "second" and "third" in the specification, and if a claim only recites the "first" member and the "third" member as defined in the specification, the claim may instead use "first" and "second" for distinction for ease of understanding. In such a case, the objects prefixed "first" and "second" in the claims will refer to those objects that are prefixed "first" and "third" in the present specification.

Embodiments of the present invention will now be described with reference to the drawings. Note however that the illustrated embodiments embody the technical concept of the present invention but are not intended to limit the scope of the present invention. In the following description, like reference signs denote like elements, and redundant descriptions may be omitted. Note that the size, relative arrangement, etc., of the members shown in the figures may be exaggerated in order to clarify the description.

Embodiment

Figure 1:
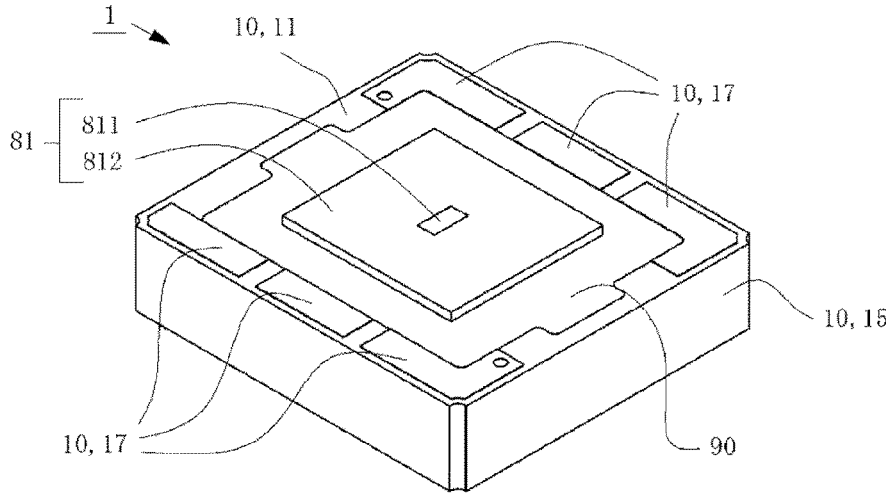
FIG. 1 is a perspective view of a light emitting device according to an embodiment.
Figure 2:
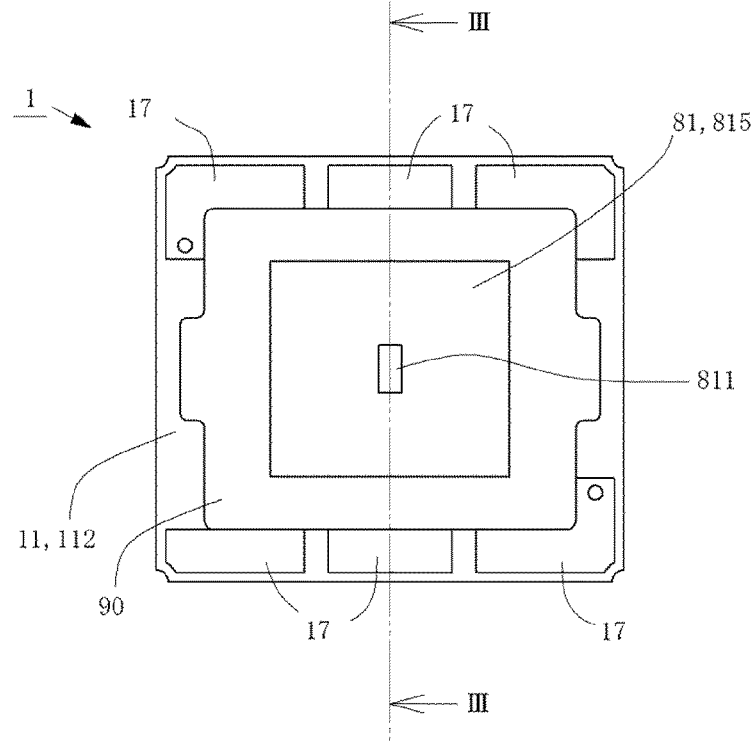
FIG. 2 is a top view corresponding to FIG. 1.
Figure 3:
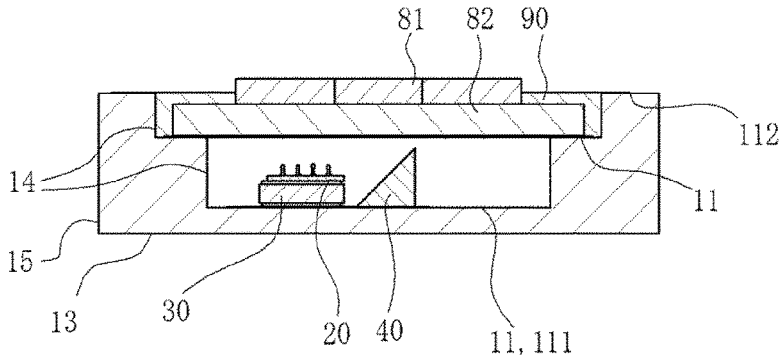
FIG. 3 is a cross-sectional view of the light emitting device taken along line III-III of FIG. 2.
Figure 4:
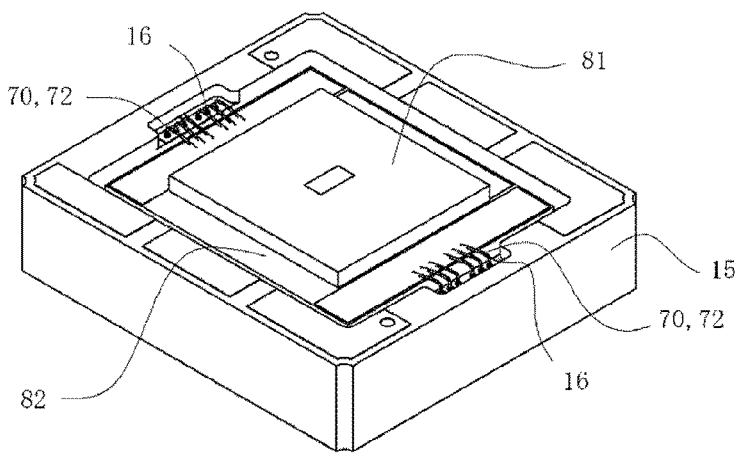
FIG. 4 is a perspective view for illustrating the internal structure of the light emitting device according to an embodiment.
Figure 5:
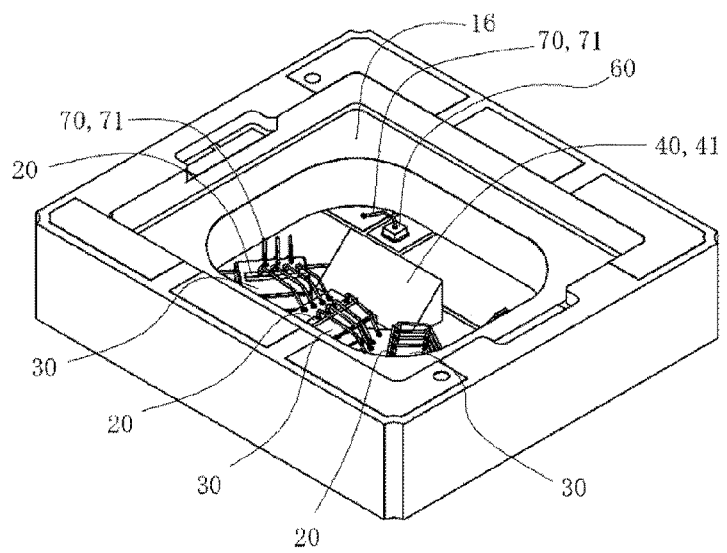
FIG. 5 is a perspective view for illustrating the internal structure of the light emitting device according to an embodiment.
Figure 6:
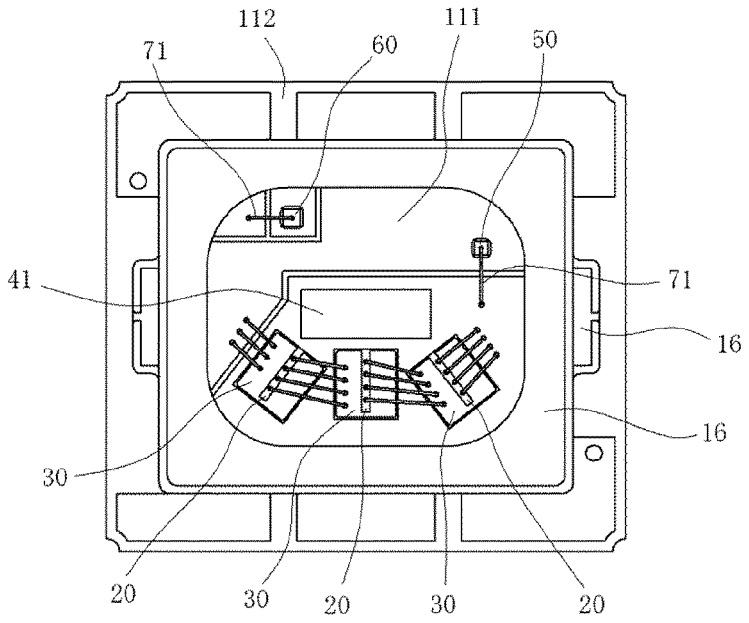
FIG. 6 is a top view corresponding to FIG. 5.
Figure 7:
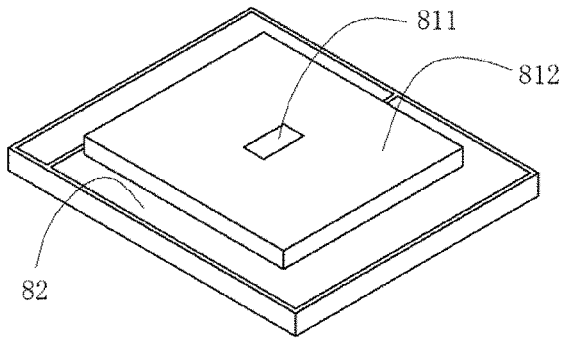
FIG. 7 is a perspective view showing a wavelength conversion member and a light-transmissive member bonded together according to an embodiment.
Figure 8:
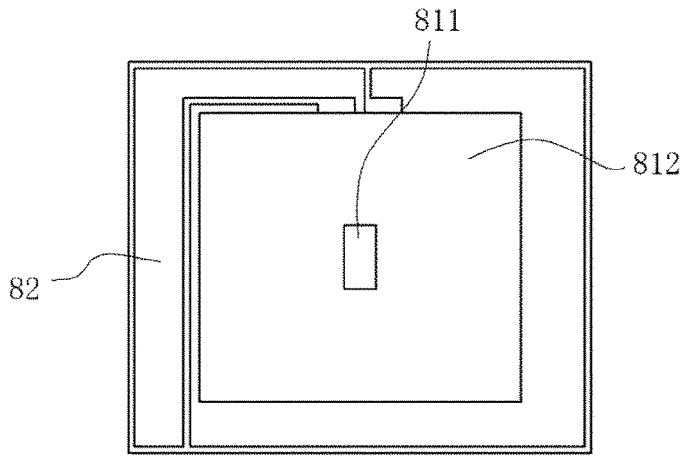
FIG. 8 is a top view corresponding to FIG. 7.
Figure 9:
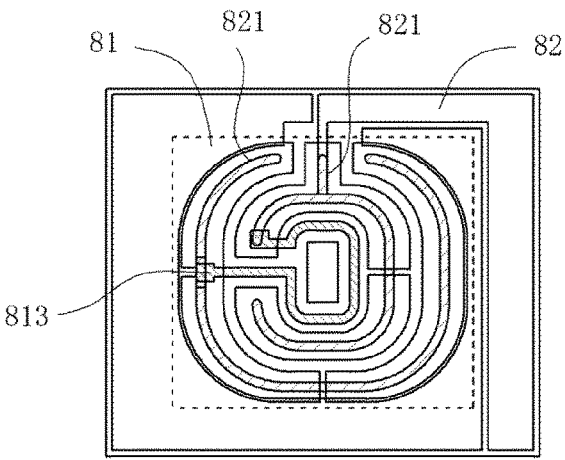
FIG. 9 is a top view seen through the upper surface of the wavelength conversion member for illustrating the bonding surface between the light-transmissive member and the wavelength conversion member according to an embodiment.
Figure 10:
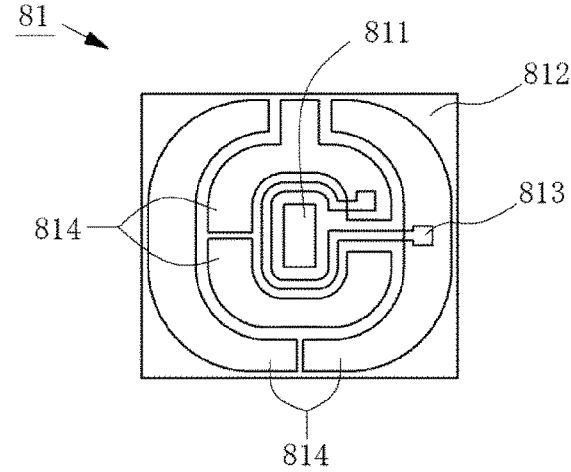
FIG. 10 is a bottom view of the wavelength conversion member according to an embodiment.
Figure 11:
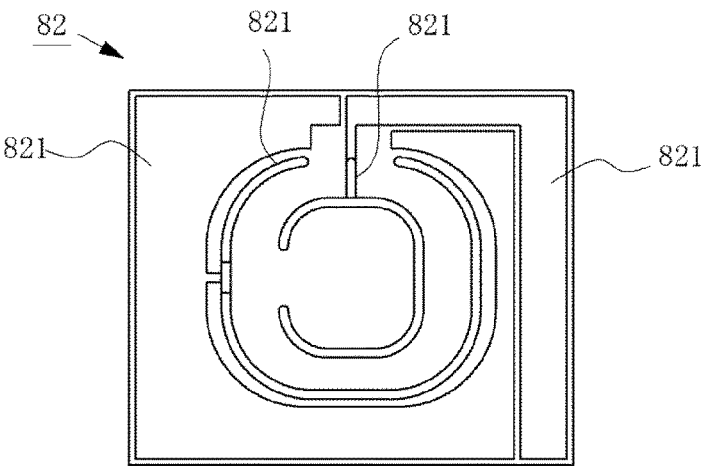
FIG. 11 is a top view of the light-transmissive member according to an embodiment.

FIG. 1 is a perspective view showing an example of a light emitting device 1 according to an embodiment. FIG. 2 is a top view of the light emitting device 1. FIG. 3 is a cross-sectional view of the light emitting device 1 taken along line III-III of FIG. 2. FIG. 4 is a perspective view where a light-blocking member 90 is removed from the light emitting device 1 for illustrating the internal structure. FIG. 5 is a perspective view where a light-transmissive member 82 and a wavelength conversion member 81 are further removed from the light emitting device 1 for illustrating the internal structure. FIG. 6 is a top view in the same state as FIG. 5. FIG. 7 is a perspective view showing the wavelength conversion member 81 and the light-transmissive member 82 bonded together according to an embodiment. FIG. 8 is a top view in the same state as FIG. 7. FIG. 9 is a top view seen through the upper surface of the wavelength conversion member 81 for illustrating the bonding surface between the light-transmissive member 82 and the wavelength conversion member 81. Note that in FIG. 9, the bonding region in a metal film 821 of the light-transmissive member 82 and a conductive film 813 of the wavelength conversion member 81 are marked with hatching. The fine hatching is the conductive film 813. FIG. 10 is a bottom view of the wavelength conversion member 81 according to an embodiment. FIG. 11 is a top view of the light-transmissive member 82 according to an embodiment.

The components of the light emitting device 1 include a base 10, a plurality of light-emitting elements 20, one or more submounts 30, one or more light reflective members 40, a protective element 50, a temperature measuring element 60, a plurality of wires 70, the wavelength conversion member 81, the light-transmissive member 82, and the light-blocking member 90. The light emitting device 1 may further include other components.

Next, the components will be described.
(Base 10)

The base 10 has a plurality of upper surfaces 11, lower surfaces 13, one or more inner lateral surfaces 14, and one or more outer lateral surfaces 15. The base 10 has a concave shape that is depressed downward. The base 10 has a rectangular outer shape in a top view.

The plurality of upper surfaces 11 includes a bottom surface 111. The bottom surface 111 is a mounting surface on which other components are arranged. The bottom surface 111 is the lowermost upper surface of the plurality of upper surfaces 11. The plurality of upper surfaces 11 includes the top surface 112, which is the uppermost upper surface. The bottom surface 111 is surrounded by the top surface 112 in a top view.

The plurality of upper surfaces 11 includes one or more upper surfaces 11 located between the top surface 112 and the bottom surface 111. Here, When distinguishing between these one or more upper surfaces 11, the upper surfaces 11 will be numbered, i.e., the first upper surface 11, the second upper surface 11, and so on, starting from the lowest height from the bottom surface 111.

The base 10 has a plurality of stepped portions 16 having different heights from the bottom surface 111. Here, the stepped sections 16 are composed only of the upper surface 11 and all the inner lateral surfaces 14 that intersect and extend downwardly with this upper surface 11. The plurality of stepped portions 16 includes a stepped portion 16 composed of the top surface 112 and all the inner lateral surfaces 14 that intersect and extend downwardly therewith, and a stepped portion 16 composed of the first upper surface 11 and all the inner lateral surfaces 14 that intersect and extend downwardly therewith.

When distinguishing between the plurality of stepped portions 16, the stepped portions 16 will be numbered, i.e., the first stepped portion 16, the second stepped portion 16, and so on, starting from the lowest height of the stepped portion 16 from the bottom surface 111 to the upper surface 11. In the illustrated example of the base 10, there is one first upper surface 11 and two second upper surfaces 11 between the top surface 112 and the bottom surface 111, with the first stepped portion 16 including the first upper surface, two second stepped portions 16 each including the second upper surface 11, and a third stepped portion 16 including the top surface 112.

The base 10 can be formed using a ceramic as its primary material. For example, aluminum nitride, silicon nitride, aluminum oxide or silicon carbide can be used as the ceramic. In addition to ceramics, other insulating materials can be used as the primary material.

One or more metal films are provided on the bottom surface 111 of the base 10. One or more metal films are provided on the upper surface 11 of the stepped portion 16 of the base 10. A plurality of metal films 17 that are electrically connected to the metal films provided on the bottom surface 111 and the stepped portion 16 are provided on the top surface 112 of the base 10.
(Light-Emitting Element 20)

The light-emitting element 20 has an upper surface, a lower surface, and one or more lateral surfaces. The light-emitting element 20 has one or more light-exiting surfaces that emit light in the upper surface, the lower surface and one or more lateral surfaces.

The light-emitting element 20 is, for example, a semiconductor laser element. Note that the light-emitting element 20 is not limited to a semiconductor laser element, but may be, for example, a light-emitting diode (LED) or an organic light-emitting diode (OLED). In the illustrated example of the light emitting device 1, a semiconductor laser element is employed as the light-emitting element 20.

The semiconductor laser element has a rectangular outer shape in a top view. The lateral surface intersecting one of the two short sides of the rectangular shape is the light-exiting surface of the semiconductor laser element. The upper surface and the lower surface of the semiconductor laser element have a larger area than the light-exiting surface.

Note that the light (laser light) emitted from the semiconductor laser element has a spread and forms an elliptical far-field pattern (hereinafter referred to as "FFP") in the plane parallel to the light-exiting surface. Here, FFP indicates the shape and light intensity distribution of the emitted light at a position away from the light-exiting surface.

The light passing through the center of the elliptical shape of the FFP, in other words, the light of peak intensity in the light intensity distribution of the FFP, will be referred to as light traveling along the optical axis. The optical path of the light traveling along the optical axis will be referred to as the optical axis of the light. In the light intensity distribution of the FFP, the light with an intensity equal to or greater than $1/e^2$ of the peak intensity value will be referred to as the "main portion" of light.

In the elliptical shape of the FFP of light emitted from the light-emitting element 20, which is a semiconductor laser element, the direction of the short diameter of the ellipse will be referred to as the parallel direction of the FFP and the direction of the long diameter will be referred to as the perpendicular direction of the FFP. A plurality of layers, including the active layer, that constitute the semiconductor laser element are stacked in the perpendicular direction of the FFP.

Based on the optical intensity distribution of the FFP of the semiconductor laser element, the angle corresponding to the full width at half maximum of the optical intensity distribution will be referred to as the light spread angle of the semiconductor laser element. The light spread angle in the perpendicular direction of the FFP will be referred to as the spread angle in the perpendicular direction, and the light spread angle in the parallel direction of the FFP will be referred to as the spread angle in the parallel direction.

The light-emitting element 20 is not limited to a semiconductor laser element, but can employ a light-emitting element that has at least some of the characteristics of the semiconductor laser element described above. It is also possible to employ a light-emitting element that does not have these characteristics.

The light-emitting element 20 emits light whose emission peak wavelength is in the range of 320 nm to 530 nm, typically in the range of 430 nm to 480 nm. The light-emitting element 20 that emits such light may be a semiconductor laser element that includes a nitride semiconductor. For example, GaN, InGaN and AlGaN can be used as a nitride semiconductor. Note that the light emitted from the light-emitting element 20 does not need to be limited to such a wavelength range.

(Submount 30)

A submount 30 has a lower surface, an upper surface, and one or more lateral surfaces. The submount 30 has the smallest width in the up-down direction. The submount 30 is formed in a rectangular parallelepiped shape. Note that the shape is not limited to rectangular parallelepiped. The submount 30 is formed using, for example, silicon nitride, aluminum nitride or silicon carbide. Note that other materials may be used.

(Light Reflective Member 40)

A light reflective member 40 has one or more light reflective surfaces 41 that reflect light. For example, the light reflective member 40 has a light reflective surface 41 that has a light reflectance of 90% or more for the peak wavelength of the irradiated light. The light reflectance here may be less than or equal to 100% or less than 100%.

The light reflective surface 41 is a flat surface. The light reflective surface 41 is oblique relative to the lower surface of the light reflective member 40. This inclination angle is in the range of 10 degrees or more and 80 degrees or less. The direction through a straight line that passes on the light reflective surface 41 and is parallel to the lower surface of the light reflective member 40 will be referred to as the parallel direction of the light reflective surface 41. Note that the light reflective surface 41 does not have to be a flat surface, and it may be a curved surface, for example. In this case, the direction through a straight line on a plane that connects together three points on the outer edge of the curved light reflective surface 41 and parallel to the lower surface of the light reflective member 40 will be referred to as the parallel direction of the light reflective surface 41.

In the illustrated example of the light reflective member 40, the inclination angle of the light reflective surface 41 is 45 degrees. Note that when describing the specific angle of the inclination angle, it is assumed that the manufactured product includes a difference of ±5 degrees from that specific angle in consideration of manufacturing accuracy.

The light reflective member 40 may use a glass, a metal, or the like, as the primary material forming its outer shape. The primary material should be a heat-resistant material, e.g., a glass such as quartz or BK7 (borosilicate glass), a metal such as aluminum, or Si. The light reflective surface can be formed using, for example, a metal such as Ag, Al, or a dielectric multilayer film such as $Ta_2O_5/SiO_2$, $TiO_2/SiO_2$, $Nb_2O_5/SiO_2$, etc.

(Protective Element 50)

A protective element 50 is a circuit element to prevent certain elements, such as light-emitting elements, from being destroyed by excessive current flow. A typical example of the protective element 50 is a constant voltage diode such as a Zener diode. The Zener diode may be an Si diode, for example.

(Temperature Measuring Element 60)

A temperature measuring element 60 is an element used as a temperature sensor for measuring the temperature of the surrounding area. The temperature measuring element 60 may be a thermistor, for example.

(Wire 70)

A wire 70 is formed of a conductor having a linear shape of which the opposite ends serve as connecting portions. In other words, the wire 70 includes connecting portions for the connection with other components at opposite ends of the linear portion. The wire 70 is used for electrical connection between two components. The wire 70 may be a metal wire, for example. Examples of metals include gold, aluminum, silver, copper, etc.

(Wavelength Conversion Member 81)

The wavelength conversion member 81 has an upper surface, a lower surface, and one or more lateral surfaces. The wavelength conversion member 81 has a wavelength conversion portion 811. The wavelength conversion member 81 also has a surrounding portion 812 surrounding the wavelength conversion portion 811. The wavelength conversion member 81 has one or more conductive films 813 on the lower surface side. The wavelength conversion member 81 also has a plurality of metal films 814 on the lower surface side. The wavelength conversion member 81 also has a light-blocking film 815 on the upper surface side.

In the wavelength conversion member 81, the wavelength conversion portion 811 and the surrounding portion 812 are integrally formed. The inner lateral surface of the surrounding portion 812 is in contact with the lateral surface of the wavelength conversion portion 811, and one or more lateral surfaces of the wavelength conversion portion 811 are enclosed by the surrounding portion 812. One or more outer lateral surfaces of the surrounding portion 812 correspond to one or more lateral surfaces of the wavelength conversion member 81. The wavelength conversion portion 811 and the surrounding portion 812 can be formed using, as the primary material, an inorganic material that is not easily decomposed by light irradiation. Note that it does not have to be an inorganic material.

The wavelength conversion member 81 is formed of an integral sinter in which the wavelength conversion portion

811 and the surrounding portion 812 are integrally sintered. For example, such an integral sinter can be formed by integrally forming and sintering the wavelength conversion portion 811, which is made of a molded product of a sinter, or the like, and a powder material of the surrounding portion 812 to form the base material of the wavelength conversion member 81. For sintering, for example, an atmospheric pressure sintering method, a discharge plasma sintering method (SPS method) or a hot press sintering method (HP method), etc., can be used.

The wavelength conversion portion 811 has a rectangular parallelepiped shape. Note that the shape of the wavelength conversion portion 811 is not limited to rectangular parallelepiped. The wavelength conversion portion 811 has a vertically elongated shape in a top view. The wavelength conversion portion 811 has a vertically elongated shape as viewed from below. In the wavelength conversion portion 811, the direction of the vertically elongated shape as seen from above is aligned with that as seen from below.

The wavelength conversion portion 811 converts the incident light into light of different wavelengths. The wavelength conversion portion 811 also emits light converted to different wavelengths. A portion of the incident light is not converted by the wavelength conversion portion 811 and is emitted from the wavelength conversion portion 811.

The wavelength conversion portion 811 can be formed by using a ceramic as the primary material, with a phosphor contained therein. There is no limitation thereto, and a glass may be the primary material. Alternatively, it can be formed of a polycrystal of a single phosphor or a single crystal of a phosphor.

For example, when a ceramic is used as the primary material of the wavelength conversion portion 811, it can be formed by sintering a phosphor and a light-transmissive material such as aluminum oxide. The phosphor content may be set to 0.05% by volume to 50% by volume of the total volume of the ceramic. For example, a ceramic consisting substantially only of a phosphor, which is obtained by sintering a powder phosphor, may be used.

Phosphors include cerium-activated yttrium aluminum garnet (YAG), cerium-activated lutetium aluminum garnet (LAG), europium- and/or chromium-activated nitrogen-containing calcium aluminosilicate ($CaO—Al_2O_3—SiO_2$), europium-activated silicate (($Sr,Ba)_2SiO_4$), $\alpha$-sialon phosphor, $\beta$-sialon phosphor, and others. Among these, it is preferable to use a YAG phosphor, which has good heat resistance and can emit white light when combined with blue excitation light.

The surrounding portion 812 is in the form of a rectangular parallelepiped flat plate with a through hole in the central portion. The wavelength conversion portion 811 is provided so as to fill the through hole. The surrounding portion 812 can be formed using a ceramic as the primary material. There is no limitation thereto, and a metal or a composite of a ceramic and a metal may be used.

Preferably, a material of high thermal conductivity for dissipating heat from the wavelength conversion portion 811 is used for the surrounding portion 812. The surrounding portion 812, in which a material of high thermal conductivity is used as the primary material, has a heat dissipation function to dissipate the heat in the wavelength conversion portion 811, and from this perspective, it can be regarded as a heat dissipating member in place of the surrounding portion 812.

Preferably, the surrounding portion 812 is a material that reflects the light emitted from the light-emitting element 20 and the fluorescence emitted from the phosphor with a high reflectance. Preferably, the surrounding portion 812 has a high reflectance at least in a region that is in contact with one or more lateral surfaces of the wavelength conversion portion 811. The surrounding portion 812 in which a material with a high reflectance is used as the primary material has a high reflectance to reflect irradiated light, and from this perspective, the surrounding portion 812 can be considered a light reflective member. The material having a high reflectance and a high thermal conductivity may be alumina ($Al_2O_3$), for example.

The surrounding portion 812 does not have a wavelength conversion function like the wavelength conversion portion 811. For example, the surrounding portion 812 does not contain a phosphor. The surrounding portion 812 has a light-blocking property with a transmittance of 5% or less. From this perspective, the surrounding portion 812 can be considered as a light-blocking member.

The conductive film 813 is provided on the surrounding portion 812. The conductive film 813 is provided outside of the wavelength conversion portion 811. That is, the conductive film 813 is not provided on the wavelength conversion portion 811. This allows light to efficiently enter the wavelength conversion portion 811.

The conductive film 813 is provided at a position close to the wavelength conversion portion 811. For example, the distance between the wavelength conversion portion 811 and the conductive film 813 is 500 $\mu$m or less, preferably 300 $\mu$m or less, at the closest position. The conductive film 813 is provided so as to surround the wavelength conversion portion 811. In the wavelength conversion member 81 illustrated herein, the linear conductive film 813 surrounds the wavelength conversion portion 811.

Preferably, the conductive film 813 surrounds the wavelength conversion portion 811 in a thin linear shape. For example, a thin linear shape denotes a linear shape in which the line width is smaller than the width of the wavelength conversion portion 811 and the line length is longer than the circumference of the wavelength conversion portion 811, as viewed from below. For example, the line width may be less than or equal to ½ the width of the wavelength conversion portion 811. Here, the width of the wavelength conversion portion 811 is the width of the short side if the outer shape is a rectangular shape, for example, or the width of the short diameter if the outer shape is an elliptical shape, for example. In the case of other shapes, the width is substantially specified based on these examples.

The conductive film 813 may be formed of an oxide. Examples of oxides forming the conductive film 813 include indium tin oxide (ITO) and ruthenium oxide ($RuO_2$). These oxides are more brittle and crackable than metal materials such as gold, silver, aluminum, etc.

The plurality of metal films 814 are provided on the surrounding portion 812, and the plurality of metal films 814 are provided outside of the wavelength conversion portion 811. That is, the plurality of metal films 814 are not provided on the wavelength conversion portion 811. This allows light to efficiently enter the wavelength conversion portion 811. The plurality of metal films 814 includes two metal films 814 that are each connected to the conductive film 813. One of the opposite ends of the linear conductive film 813 is aligned with one of the two metal films 814, and the other end of the conductive film 813 is aligned with the other metal film 814. The metal film 814 can be formed using Ti/Pt/Au, for example.

The light-blocking film 815 is provided on the surrounding portion 812, and the light-blocking film 815 is provided outside of the wavelength conversion portion 811. That is, the light-blocking film 815 is not provided on the wavelength conversion portion 811. Preferably, the light-blocking film 815 reaches the boundary between the wavelength conversion portion 811 and the surrounding portion 812 on the upper surface side. This can suppress the emission of light from other than the wavelength conversion portion 811 of the wavelength conversion member 81. The light-blocking film 815 can be formed using a metal, for example.

(Light-Transmissive Member 82)

The light-transmissive member 82 has a lower surface, an upper surface, and one or more lateral surfaces. The light-transmissive member 82 is light-transmissive and allows light to pass therethrough. Here, being light-transmissive is defined as a light transmittance of 80% or more. The light-transmissive member 82 has a base material formed in a rectangular parallelepiped flat plate shape. Note that the shape is not limited to rectangular parallelepiped.

The light-transmissive member 82 can be formed using sapphire as the primary material. Sapphire is a material with a relatively high transmittance and a relatively high strength. Note that quartz, silicon carbide, or glass, for example, can be used as the primary material, in addition to sapphire.

The light-transmissive member 82 also has a plurality of metal films 821. The plurality of metal films 821 are provided on the upper surface side of the light-transmissive member 82. The plurality of metal films 821 includes two metal films 821 provided for wiring. The two metal films 821 are provided in a peripheral region of the light-transmissive member 82. The two metal films 821 are not provided in a central region of the light-transmissive member 82.

The two metal films 821 have a bonding region in a portion thereof. The metal film 821 can be formed by providing Ti/Pt/Au, for example. In the bonding region, AuSn can be further provided thereon, for example.

(Light-Blocking Member 90)

The light-blocking member 90 is formed of a light-blocking resin. Here, being light-blocking refers to the property of not allowing light to pass therethrough, and light-blocking properties may be achieved by using light-absorbing or light-reflecting properties as well as light-blocking properties. For example, it can be formed by including a filler such as a light-diffusing material and/or a light-absorbing material, etc., in the resin.

Examples of resins that form the light-blocking member 90 include an epoxy resin, a silicone resin, an acrylate resin, a urethane resin, a phenolic resin, a BT resin, and the like. Examples of the light-absorbing fillers include dark-color pigments such as carbon black.

(Light-Emitting Device 1)

Next, the light emitting device 1 manufactured using these components will be described. First, one or more light reflective members 40 are arranged on the mounting surface of the base 10. The lower surfaces of one or more light reflective members 40 are bonded to the mounting surface of the base 10. The inclination angle of the light reflective surface 41 relative to the mounting surface of the base 10 is the same as the inclination angle of the light reflective surface 41 relative to the lower surface of the light reflective members 40.

One or more light reflective members 40 are arranged, and one or more light reflective surfaces 41 are provided on one virtual plane. In the illustrated example of the light emitting device 1, one light reflective member 40 is arranged, and one light reflective surface 41 is provided on one virtual plane. Note that there may be arranged a plurality of light reflective members 40 of a size obtained by dividing the illustrated light reflective member 40 into two or more pieces. In this case, a plurality of light reflective surfaces 41 are provided on one virtual plane.

Next, the protective element 50 and the temperature measuring element 60 are arranged on the mounting surface of the base 10. On the mounting surface, the protective element 50 is positioned, with respect to one or more light reflective members 40, in a direction opposite to the direction in which one or more light reflective surfaces 41 face. On the mounting surface, the temperature measuring element 60 is positioned, with respect to one or more light reflective members 40, opposite to the direction in which one or more light reflective surfaces 41 face. By effectively utilizing the space behind the light reflective surfaces 41, the light emitting device 1 can be made smaller.

Next, one or more submounts 30 are arranged on the mounting surface of the base 10. In one or more submounts 30, a plurality of lateral surfaces face toward one or more light reflective surfaces 41. The plurality of lateral surfaces have different orientations with respect to the parallel direction of the light reflective surface 41 in a top view. The plurality of lateral surfaces includes one or more lateral surfaces whose lines of intersection with the upper surface of the submount 30 are parallel to the parallel direction of one or more light reflective surfaces 41 in a top view. The plurality of lateral surfaces include one or more lateral surfaces whose lines of intersection with the upper surface of the submount 30 are not parallel to the parallel direction of one or more light reflective surfaces 41 in a top view. Note that being parallel as used herein includes a difference of ±5 degrees.

In the illustrated example of the light emitting device 1, three submounts 30 are arranged on the mounting surface. Each of these three submounts 30 has a lateral surface facing toward the light reflective surface 41. The three submounts 30 are composed of, in a top view, one submount 30 arranged in the center and two submounts 30 arranged on the opposite sides thereof. In the two submounts 30 arranged on the opposite sides, the lateral surface facing toward the light reflective surface 41 also faces toward the submount 30 arranged in the center.

The lateral surface facing toward the light reflective surface 41 of the submount 30 arranged in the center is encircled, in a top view, by two virtual lines parallel to the parallel direction of the light reflective surface 41. One of the two lines is a straight line that connects together one of the opposite ends (that is closer to the submount 30 arranged in the center) of the lateral surface (that faces toward the light reflective surface 41) of one of the two submounts 30 arranged on the opposite sides, and that of the other one of the two submounts 30 arranged on opposite sides. The remaining one is a straight line that connects together one of the opposite ends (that is farther away from the submount 30 arranged in the center) of the lateral surface (that faces toward the light reflective surface 41) of one of the two submounts 30 arranged on opposite sides, and that of the other one of the two submounts 30 arranged on opposite sides.

Of the submount 30 arranged in the center, the line of intersection between the lateral surface facing toward the light reflective surface 41 and the upper surface is parallel to the parallel direction of the light reflective surface 41. Note that being parallel as used herein includes a difference of ±5 degrees due to manufacturing accuracy. Of the two submounts 30 arranged on opposite sides, the line of intersection between the lateral surface facing toward the light reflective surface 41 and the upper surface is not parallel to the parallel direction of the light reflective surface 41.

Of the two submounts 30 arranged on opposite sides, the lateral surfaces facing toward the light reflective surface 41 make an equal angle relative to the parallel direction of the light reflective surface 41 in a top view. Note that being equal as used herein includes a difference of ±5 degrees due to manufacturing accuracy.

Next, a plurality of light-emitting elements 20 are arranged on the mounting surface. The plurality of light-emitting elements 20 are arranged on the mounting surface via one or more submounts 30. The plurality of light-emitting elements 20 are bonded to one or more submounts 30.

Each of the plurality of light-emitting elements 20 has a light-exiting surface facing toward the light reflective surface 41. In each of the plurality of light-emitting elements 20, at least one lateral surface is a light-exiting surface. The at least one lateral surface that is a light-exiting surface includes a light-exiting surface that faces toward the light reflective surface 41.

In each of the plurality of light-emitting elements 20, light emitted from the light-exiting surface is irradiated onto one or more light reflective surfaces 41. In each of the plurality of light-emitting elements 20, light emitted from a lateral surface facing toward the light reflective surface 41 is irradiated onto one or more light reflective surfaces 41.

The lateral surfaces of the plurality of light-emitting elements 20 facing toward the light reflective surface 41 have different orientations with respect to the parallel direction of the light reflective surface 41 in a top view. The plurality of light-emitting elements 20 include one or more light-emitting elements 20 whose lateral surfaces facing toward the light reflective surface 41 are parallel to the parallel direction of one or more light reflective surfaces 41 in a top view. The light-emitting elements 20 can be said to have a light-exiting surface directly facing one or more light reflective surfaces 41.

The plurality of light-emitting elements 20 include one or more light-emitting elements 20 whose lateral surfaces facing the light reflective surface 41, in a top view, are not parallel to the parallel direction of one or more light reflective surfaces 41. The light-emitting elements 20 can be said to have their light-exiting surfaces arranged to be oblique relative to one or more light reflective surfaces 41.

Between the plurality of light-emitting elements 20, the lateral surfaces, facing toward the light reflective surface 41, of two light-emitting elements 20 that are arbitrarily selected from the plurality of light-emitting elements 20 are arranged so that one is oblique relative to the other in a top view. With the oblique configuration, light from the light-emitting elements 20 irradiated onto one or more light reflective surfaces 41 can be brought closer to each other.

In the illustrated example of light emitting device 1, three light-emitting elements 20 are arranged on the mounting surface via three submounts 30. The number of light-emitting elements 20 to be bonded to one submount 30 is one.

Also, in a top view, one light-emitting element 20 is arranged with its light-exiting surface directly facing one or more light reflective surfaces 41. On opposite sides of this light-emitting element 20 in the center, one light-emitting element 20 is arranged with its light-exiting surface being oblique with respect to one or more light reflective surfaces 41.

In a top view, the light-emitting elements 20 on opposite sides are arranged in line symmetry with respect to a straight line that passes through the lateral surface facing toward one or more light reflective surfaces 41 of the central light-emitting element 20 and is perpendicular to the parallel direction of one or more light reflective surfaces 41.

In a top view, when one or more light reflective surfaces 41 is bisected by a straight line that passes through the lateral surface facing toward one or more light reflective surfaces 41 of the central light-emitting element 20 and is perpendicular to the parallel direction of one or more light reflective surfaces 41, the light-emitting elements 20 on opposite sides each irradiate the main portion light onto one of the bisected regions that is closer thereto.

In the illustrated example of the light emitting device 1, the plurality of light-emitting elements 20 are each a semiconductor laser element. Light emitted from each of the plurality of semiconductor laser elements and passing through the optical axis travels in a different direction from its light-exiting surface and is irradiated onto one or more light reflective surfaces 41.

The plurality of semiconductor laser elements include semiconductor laser elements wherein the direction in which light traveling through the optical axis travels from the light-exiting surface is orthogonal to the parallel direction of one or more light reflective surfaces 41. The plurality of semiconductor laser elements include two semiconductor laser elements arranged in line symmetry with respect to the direction in which light passing through the optical axis travels from the light-exiting surface.

The semiconductor laser element whose light passing through the optical axis is orthogonal to the parallel direction of one or more light reflective surfaces 41 is the central light-emitting element 20 described above. The two semiconductor laser elements arranged in line symmetry are the light-emitting elements 20 on opposite sides described above.

The semiconductor laser elements on opposite sides are referred to as the first semiconductor laser element and the second semiconductor laser element, and one or more light reflective surfaces 41 are bisected along a plane, as the boundary, that is perpendicular to the mounting surface and that passes through a straight line extending in the direction in which light passing through the optical axis of light emitted from the central semiconductor laser element travels from the light-exiting surface. Where the region on the side where the first semiconductor laser element is arranged is the first reflection region and the region on the side where the second semiconductor laser element is arranged is the second reflection region, the light emitted from the first semiconductor laser element and passing through the optical axis is irradiated onto the first reflection region and the light emitted from the second semiconductor laser element and passing through the optical axis is irradiated onto the second reflective region.

Next, a plurality of wires 70 (first wires 71) are bonded that electrically connect together the light-emitting elements 20, the protective element 50 and the temperature measuring element 60. For electrical connection, a metal film provided on the bottom surface 111 of the base 10 is used. This allows electrical connection between these elements and the external power supply via the metal film on the upper surface 11 of the base 10.

Next, the wavelength conversion member 81 is arranged. The wavelength conversion member 81 is supported on the base 10. The wavelength conversion member 81 is arranged above the mounting surface. The wavelength conversion member 81 is arranged above the plurality of light-emitting elements 20 and one or more light reflective members 40.

Light emitted from the plurality of light-emitting elements 20 and reflected by one or more light reflective members 40 enters the wavelength conversion member 81. The main portion light emitted by the plurality of light-emitting elements 20 enters the wavelength conversion member 81.

In the illustrated example of the light emitting device 1, any of the light emitted from three semiconductor laser elements is reflected by one or more light reflective surfaces 41 to enter the wavelength conversion member 81. The lower surface of the wavelength conversion member 81 serves as an input surface for light emitted from the plurality of light-emitting elements 20, and the upper surface of the wavelength conversion member 81 serves as an exiting surface for wavelength-converted light or light emitted from the plurality of light-emitting elements 20.

The wavelength conversion member 81 is fixed to the base 10 via the light-transmissive member 82. In the illustrated example of the light emitting device 1, the wavelength conversion member 81 is bonded to the base 10 in the state where the wavelength conversion member 81 and the light-transmissive member 82 are bonded to each other, thereby fixing the wavelength conversion member 81 to the base 10. Note that the wavelength conversion member 81 may be fixed directly to the base 10.

The light-transmissive member 82 is arranged on the upper surface 11 of the base 10. The lower surface of the light-transmissive member 82 is bonded to the base 10. The light-transmissive member 82 is bonded to the upper surface 11 of the stepped portion 16, which is formed below the top surface 112 of the base 10.

The plurality of light-emitting elements 20 are arranged in a closed space of the light emitting device 1. The base 10 and the light-transmissive member 82 are bonded to each other, thereby creating this closed space. The light-transmissive member 82 can serve as a lid member. In the illustrated example of the light emitting device 1, this closed space is formed in a hermetically sealed state. By being hermetically sealed, it is possible to reduce the collection of organic matter, and the like, on the light-exiting surface of the semiconductor laser element.

The wavelength conversion member 81 has a light extraction region for extracting light. The light extraction region includes the light-exiting surface for light to be emitted from the light emitting device 1 to the outside and the light input surface for light to be input to emit light to the outside. Note that in the light emitting device 1, a component other than the wavelength conversion member 81 may have the light extraction region. The other component as used herein includes components that are not represented in the light emitting device 1 illustrated herein.

In the light emitting device 1, the light extraction region is smaller than the mounting surface of the base 10 in a top view. As compared with the distance between two of the plurality of light-emitting elements 20 that are most distance from each other in a top view, the length of the light extraction region in the same direction as this distance is smaller.

In the illustrated example of the light emitting device 1, the wavelength conversion portion 811 has a light extraction region. The lower surface of the wavelength conversion portion 811 is the light input surface for light in the light extraction region, and the upper surface of the wavelength conversion portion 811 is the light-exiting surface for light in the light extraction region. The light extraction region is encircled by the surrounding portion 812.

Figure 12:
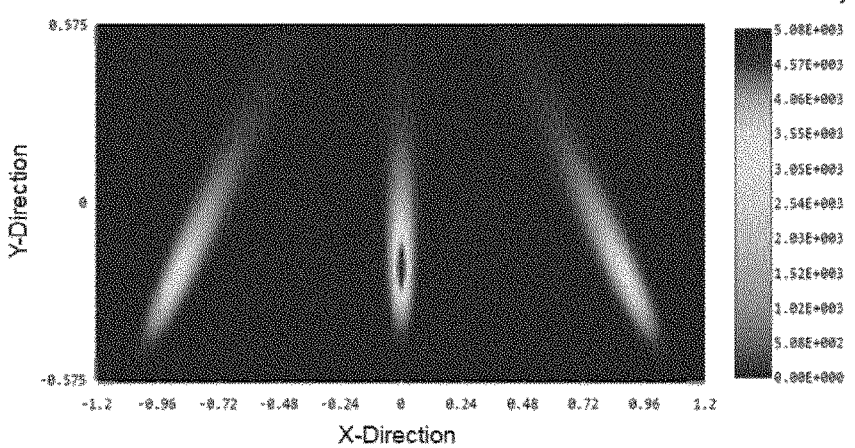
FIG. 12 is an image representing the intensity distribution of light irradiated on the light reflective surface of the light emitting device according to an embodiment.
Figure 13:
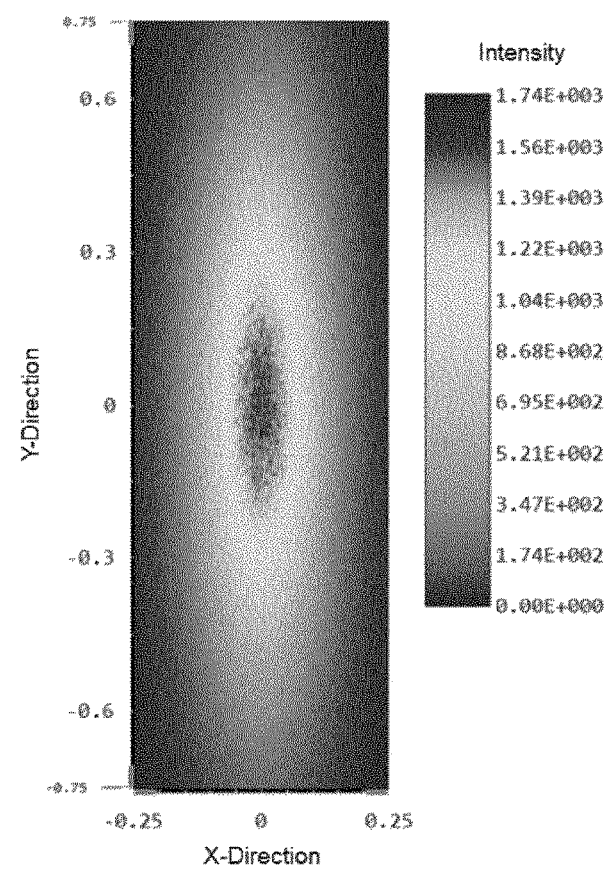
FIG. 13 is an image representing the intensity distribution of light incident on the wavelength conversion portion of the light emitting device according to an embodiment.

FIG. 12 and FIG. 13 show the light intensity distribution at the light reflective surface 41 and the light intensity distribution at the light input surface of the wavelength conversion portion 811, respectively, for light emitted from the three semiconductor laser elements in the illustrated example of the light emitting device 1. Note that while the area of high light intensity and the area of low light intensity are both in black color in the image of the figure due to monochrome processing, the black color in the central portion of the light of elliptical-shaped FFP is an area of high light intensity, and the black color at the periphery of the light of the FFP is an area of low light intensity.

As can be seen from these figures, in the light emitting device 1, light from the plurality of light-emitting elements 20 reflected by one or more light reflective surfaces 41 are brought closer to each other before entering the light extraction region of the light emitting device 1. For any two light-emitting elements 20 selected from the plurality of light-emitting elements 20, light emitted from each light-emitting element 20 includes light irradiated to a specific point on the light reflective surface 41. The light irradiated to this specific point is incident on a specific point on the input surface of the light extraction region. Then, the distance between two points on the input surface of the light extraction region is shorter than the distance between two points on the light reflective surface 41. This magnitude relationship between the two-point distances on the light reflective surface 41 and the light extraction region holds true at any irradiation point at which the main portion light is irradiated.

In one or more light reflective surfaces 41, light from the plurality of light-emitting elements 20 are not aligned parallel to each other as viewed in a plane parallel to the one or more light reflective surfaces 41, but the light are oblique relative to each other. On the other hand, at the light input surface of the wavelength conversion portion 811, the three light are aligned together. That is, at the input surface of the light extraction region, light from the plurality of light-emitting elements 20 are aligned parallel to each other as viewed in a plane parallel to this input surface. For example, when the plurality of light-emitting elements 20 are semiconductor laser elements, this relationship holds true for the long diameter direction or the short diameter direction of the elliptical FFP. Note that being parallel as used herein includes a difference of ±5 degrees.

Light from a plurality of light-emitting elements 20 having the same emission shape (e.g., FFP in the case of a semiconductor laser element) of light emitted from the light-exiting surface can be aligned with each other, with a high probability, at the light input surface of the light extraction region. By making uniform the emission shapes of light emitted from the plurality of light-emitting elements 20, 50% or more of the main portion light can be aligned, and even 80% or more of the main portion light can be aligned, for example.

In the light emitting device 1, at least a portion of the region where the wavelength conversion portion 811 is provided and a portion of the region where one or more light reflective surfaces 41 are provided are aligned with each other in a top view. Moreover, at least a portion of the light extraction region and a portion of the region where one or more light reflective surfaces 41 are provided are aligned with each other in a top view. Moreover, at least a portion of the region where the light input surface is provided in the light extraction region and a portion of the region where one or more light reflective surfaces 41 are provided are with each other in a top view.

For the parallel direction of the one or more light reflective surfaces 41, the length of the wavelength conversion portion 811 is shorter than the length between opposite ends of one or more light reflective members 40. For the parallel direction of the one or more light reflective surfaces 41, the length of the light-emitting element 811 is shorter than a length that is obtained by dividing the length between opposite ends of one or more light reflective members 40 by the number of light-emitting elements 20 that irradiate light on the one or more light-reflecting surfaces 41. In the illustrated example of the light emitting device 1, since three semiconductor laser elements irradiate, the length of the wavelength conversion portion 811 is shorter than ⅓ of the length between opposite ends of the light reflective member 40 for the parallel direction of the light reflective surface 41.

In a top view, the length of the light input surface of the wavelength conversion portion 811 in the parallel direction of one or more light reflective surfaces 41 is shorter than the length thereof in the direction perpendicular thereto. In the illustrated example of the light emitting device 1, in a top view, the length of the light reflective member 40 in the parallel direction of light reflective surface 41 is longer than the length thereof in the direction perpendicular thereto, while the length of the light input surface of the wavelength conversion portion 811 in the parallel direction of the light reflective surface 41 is shorter than the length thereof in the direction perpendicular thereto. Thus, at the light input surface, light from the plurality of light-emitting elements 20 can be condensed onto a small irradiation region.

Part or whole of the light incident on the wavelength conversion portion 811 is converted to light of a different wavelength by the wavelength conversion portion 811. The light from the plurality of light-emitting elements 20 or the wavelength-converted light is emitted from the upper surface of the wavelength conversion portion 811 to the outside of the light emitting device 1.

Now, the bonding between the wavelength conversion member 81 and the light-transmissive member 82 will be described. The wavelength conversion member 81 is bonded to the upper surface of light-transmissive member 82. The surrounding portion 812 of the wavelength conversion member 81 and the light-transmissive member 82 are bonded together. The wavelength conversion member 81 and the light-transmissive member 82 are bonded so that the metal film 814 of the wavelength conversion member 81 and the metal film 821 of the light-transmissive member 82 are electrically connected to each other. Specifically, the metal film 814 of the wavelength conversion member 81 and the metal film 821 of the light-transmissive member 82 are bonded together.

The conductive film 813, in the form of a thin linear film, surrounds the wavelength conversion portion 811 in the vicinity thereof. Therefore, if an abnormality such as a crack occurs in the wavelength conversion portion 811, the conductive film 813 also cracks in response to the impact, causing a change in the electrical connection. The abnormality of the wavelength conversion portion 811 can be detected by detecting a significant increase in resistance value. Therefore, the conductive film 813 can be said to be an abnormality detection element, a sensor that detects abnormalities in the wavelength conversion portion 811. Using the conductive film 813, which is formed of an oxide that is more brittle and easily broken compared to metal materials, can improve the detection accuracy against damage to the wavelength conversion portion.

The conductive film 813 is provided in the wavelength conversion member 81 on the input surface side where light from the light-emitting element 20 enters. The conductive film 813 is provided on the side of the wavelength conversion member 81 opposing the light-transmissive member 82. Therefore, the light-transmissive member 82 is arranged in the vicinity of the conductive film 813 without contacting the conductive film 813 or in contact with the conductive film 813.

The conductive film 813 is not provided directly below the light extraction region. The metal film 821 of the light-transmissive member 82 is not provided directly below the light extraction region. In this way, light can enter the wavelength conversion portion 811 without being blocked by the conductive film 813.

Note that the upper surface of the light-transmissive member 82 is larger than the lower surface of the wavelength conversion member 81. In a top view, the upper surface of the light-transmissive member 82 surrounds the lower surface of the wavelength conversion member 81. Alternatively, it surrounds the wavelength conversion member 81. In a top view, the two metal films 821 on the upper surface of the light-transmissive member 82 are each provided so as to span over the area that overlaps the lower surface of the wavelength conversion member 81 to the non-overlapping area.

Reference goes back to the description of the manufacturing process of the light emitting device 1. After the wavelength conversion member 81 is arranged, wires 70 (second wires 72) for electrically connecting the abnormality detection element are bonded. The metal film provided on the stepped portion 16 of the base 10 is used for the electrical connection. This allows electrical connection between the abnormality detection element and the external power supply via the metal film on the upper surface 11 of the base 10.

Next, the light-blocking member 90 is formed inside the frame by the upper surface 11 of the base 10. The light-blocking member 90 is formed so as to fill the gap between the base 10 and the wavelength conversion member 81. The light-blocking member 90 can be formed, for example, by pouring a thermosetting resin and curing the resin with heat. By providing the light-blocking member 90, light leakage from surfaces other than the light extraction surface is suppressed.

The light-blocking member 90 does not reach the upper surface of the wavelength conversion member 81. Alternatively, even if it reaches the upper surface of the surrounding portion 812, it does not reach the upper surface of the wavelength conversion portion 811. This allows the light-blocking member 90 to be provided so as to fill the gap while avoiding the wavelength conversion portion 811, which is the light extraction surface.

While the present invention has been described above, the present invention having the technical features disclosed herein is not limited to the structure described in the embodiment in the specification. For example, the present invention can also be applied to light emitting devices having components not disclosed in the embodiment, and the fact that there is a difference from the disclosed structure cannot be a basis for the inapplicability of the present invention. As viewed from the viewpoint of smallest components to complete the invention, it can be said that the light emitting device disclosed by the embodiment can include components that are not essential.

This means that the light emitting device disclosed by the embodiment herein include not only the viewpoint of completing the invention, but also the viewpoint of disclosing a reasonable configuration assuming one form of use. While the application of the invention is not limited to that illustrative form of use, there are aspects that function effectively when applied to that form of use.

In this regard, it may not be essential for the present invention (the claims) to have all the components disclosed in one embodiment. For example, where a claim does not recite some of the components of the light emitting device disclosed by the embodiment, the claimed invention is applicable with some degree of design freedom allowed for a person of ordinary skill in the art to make replacement, omission, change in shape, change in material for those unrecited components, without limiting them to those components disclosed in the present embodiment.

The light emitting device described in the embodiment can be used for an on-vehicle headlight. That is, an on-vehicle headlight is one form of use to which the present disclosure is applied. Note that the present disclosure can be used for other light sources such as lighting, projectors, head-mounted displays and backlights for other displays.

REFERENCE CHARACTER LIST 1 light emitting device
10 base
11 upper surface
111 bottom surface
112 top surface
13 lower surface
14 inner lateral surface
15 outer lateral surface
16 stepped portion
17 metal film
20 light-emitting element
30 submount
40 light reflective member
41 light reflective surface
50 protective element
60 temperature measuring element
70 wire
71 first wire
72 second wire
81 wavelength conversion member
811 wavelength conversion portion
812 surrounding portion
813 conductive film
814 metal film
815 light-blocking film
82 light-transmissive member
821 metal film
90 light-blocking member

The invention claimed is:

1. A light emitting device, comprising:
a base having a mounting surface;
one or more light reflective members arranged on the mounting surface and comprising one or more co-planar light reflective surfaces that are oblique relative to the mounting surface;
a first light-emitting element having a first light-exiting surface facing toward the one or more co-planar light reflective surfaces, arranged on the mounting surface such that the first light-exiting surface is oblique relative to the one or more co-planar light reflective surfaces in a top view, wherein light emitted from the first light-exiting surface is irradiated directly on the one or more co-planar light reflective surfaces;
a first submount on which the first light-emitting element is disposed;

a second light-emitting element having a second light-exiting surface facing toward the one or more co-planar light reflective surfaces, arranged on the mounting surface such that the second light-exiting surface is oblique relative to the first light-exiting surface in the top view, wherein light emitted from the second light-exiting surface is irradiated directly on the one or more co-planar light reflective surfaces; and
a second submount on which the second light-emitting element is disposed, wherein:
the one or more co-planar light-reflective surfaces face in a direction that is inclined upward and away from a side of the light emitting device on which the first and second light-emitting elements are located, and
light from the first light-emitting element and light from the second light-emitting element reflected by the one or more co-planar light reflective surfaces are brought closer to each other before entering a light extraction region of the light emitting device.

2. The light emitting device according to claim 1, wherein:
the first light-emitting element is a first semiconductor laser element having an upper surface, a lower surface and a side surface that serves as the first light-exiting surface;
light emitted from the first light-exiting surface and passing through an optical axis travels in a first direction from the first light-exiting surface to be irradiated on the one or more co-planar light reflective surfaces;
the second light-emitting element is a second semiconductor laser element having an upper surface, a lower surface and a side surface that serves as the second light-exiting surface; and
light emitted from the second light-exiting surface and passing through an optical axis travels in a second direction, which is different from the first direction, from the second light-exiting surface to be irradiated on the one or more co-planar light reflective surfaces.

3. The light emitting device according to claim 2, further comprising a third semiconductor laser element having an upper surface, a lower surface and a side surface that serves as a third light-exiting surface from which light is emitted, wherein light emitted from the third light-exiting surface and passing through an optical axis travels in a third direction, which is different from the first direction and the second direction, from the third light-exiting surface to be irradiated on the one or more co-planar light reflective surfaces.

4. The light emitting device according to claim 3, further comprising a wavelength conversion member on which light emitted from the first semiconductor laser device and reflected by the one or more light reflective members, light emitted from the second semiconductor laser device and reflected by the one or more light reflective members, and light emitted from the third semiconductor laser device and reflected by the one or more light-emitting members are incident.

5. The light emitting device according to claim 4, wherein:
the wavelength conversion member has a light extraction region; and
at least a portion of the light extraction region of the wavelength conversion member overlaps with a portion of a region where the one or more co-planar light reflective surfaces are provided as the mounting surface is viewed from above.

6. The light emitting device according to claim 3, wherein a parallel direction of the one or more co-planar light reflective surfaces and the third direction are orthogonal to each other.

7. The light emitting device according to claim 3, wherein the first semiconductor laser element and the second semiconductor laser element are arranged in line symmetry with respect to the third direction as the mounting surface is viewed from above.

8. The light emitting device according to claim 3, wherein:

where the one or more co-planar light reflective surfaces are bisected along a plane, as a boundary, that is perpendicular to the mounting surface and that passes through an optical axis of light emitted from the third semiconductor laser element and through a straight line extending in the third direction, a region on a side where the first semiconductor laser element is arranged is a first reflection region and a region on a side where the second semiconductor laser element is arranged is a second reflection region;

light emitted from the first semiconductor laser element and passing through an optical axis is irradiated on the first reflection region; and light emitted from the second semiconductor laser element and passing through an optical axis is irradiated on the second reflection region.

9. The light emitting device according to claim 3, wherein as the mounting surface is viewed from above, an intersection between a straight line that extends in the first direction and passes through an optical axis of light emitted from the first semiconductor laser element and a straight line that extends in the second direction and passes through an optical axis of light emitted from the second semiconductor laser element is on a straight line that extends in the third direction and passes through an optical axis of light emitted from the third semiconductor laser element and is outside of the one or more reflective surfaces.

10. The light emitting device according to claim 1, wherein:

the one or more light reflective members are formed by one light reflective member; and the one or more reflective surfaces are formed by one reflective surface provided on the one light reflective member.

11. The light emitting device according to claim 4, wherein:

the wavelength conversion member has a light extraction region, in a top view, a distance between the first light-emitting element and the second light emitting element is greater than a length of the light extraction region in the same direction as this distance, and in a top view, the first light-emitting element and the second light emitting element are most distance from each other among the first light-emitting element, the second light-emitting element, and the third light-emitting element.

12. The light emitting device according to claim 11, wherein:

the wavelength conversion member includes a wavelength conversion portion and a surrounding portion, the wavelength conversion portion having a light input surface and one or more lateral surfaces, the surrounding portion surrounding the one or more lateral surfaces of the wavelength conversion portion, and the light extraction region is included in the wavelength conversion portion and encircled by the surrounding portion.

13. The light emitting device according to claim 12, wherein:

in a top view, a length of the light input surface of the wavelength conversion portion in the parallel direction of one or more co-planar light reflective surfaces is shorter than a length of the light input surface in the direction perpendicular to the parallel direction.

14. The light emitting device according to claim 7, wherein the first semiconductor laser element and the third semiconductor laser element are not arranged in line symmetry with respect to the second direction as the mounting surface is viewed from above.

15. The light emitting device according to claim 14, wherein the second semiconductor laser element and the third semiconductor laser element are not arranged in line symmetry with respect to the first direction as the mounting surface is viewed from above.

16. The light emitting device according to claim 1, wherein:

the base having one or more inner lateral surfaces and uppermost upper surface by which the mounting surface is surrounded in a top view, a center point of the mounting surface in the direction perpendicular to the parallel direction of one or more co-planar light reflective surfaces is included in the one or more co-planar light reflective surfaces.

* * * * *